(12) United States Patent
Furuhata (10) Patent No.: US 9,190,477 B2
(45) Date of Patent: Nov. 17, 2015

(54) SEMICONDUCTOR DEVICE AND MANUFACTURING METHOD THEREFOR

(71) Applicant: SEIKO EPSON CORPORATION, Tokyo (JP)

(72) Inventor: Tomoyuki Furuhata, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/251,052

(22) Filed: Apr. 11, 2014

(65) Prior Publication Data

US 2014/0312415 A1 Oct. 23, 2014

(30) Foreign Application Priority Data

Apr. 17, 2013 (JP) ................. 2013-086352

(51) Int. Cl.
*H01L 29/78* (2006.01)
*H01L 29/423* (2006.01)
*H01L 29/66* (2006.01)

(52) U.S. Cl.
CPC ...... *H01L 29/4232* (2013.01); *H01L 29/66681* (2013.01); *H01L 29/7816* (2013.01); *H01L 2229/00* (2013.01)

(58) Field of Classification Search
CPC ................. H01L 29/4232; H01L 29/66681; H01L 29/7816
See application file for complete search history.

(56) References Cited

U.S. PATENT DOCUMENTS 6,046,474 A * 4/2000 Oh et al. .................. 257/343
2008/0061368 A1 3/2008 Williams et al.

FOREIGN PATENT DOCUMENTS

JP  A-2009-539259  11/2009
WO  WO 2007/142937 A2  12/2007

* cited by examiner

*Primary Examiner* — Long Pham
(74) *Attorney, Agent, or Firm* — Oliff PLC (57) ABSTRACT

A semiconductor device includes: a semiconductor substrate including a first surface; a body region positioned in the semiconductor substrate and positioned to be in contact with the first surface; a gate insulating film positioned to be in contact with the body region on the first surface; a gate electrode positioned on the gate insulating film; a first insulator film covering at least a portion of a side surface of the gate electrode; a contact region positioned to be in contact with the first surface at a position different from that of the gate electrode, in a plan view relative to the first surface, in the body region; and a second insulator film including a material different from that of the first insulator film, positioned on the body region, the gate electrode, and the first insulator film, and including a contact hole on the contact region.

11 Claims, 7 Drawing Sheets

SEMICONDUCTOR DEVICE AND MANUFACTURING METHOD THEREFOR

BACKGROUND

1. Technical Field

The present invention relates to a semiconductor device and a manufacturing method therefore.

2. Related Art

As MOS transistors that handle a large amount of power, DMOS (Double diffused Metal Oxide Semiconductor) transistors have been known.

U.S. Patent Application Publication No. 2008/0061368 (Patent Document 1) discloses a DMOS transistor including a gate oxide film and a gate electrode that are positioned on a first surface of a semiconductor substrate and an n-type source contact region and a p-type body contact region that are positioned to be in contact with the first surface at positions different from a position of the gate electrode in a plan view relative to the first surface of the semiconductor substrate. In Patent Document 1, a sidewall oxide film is formed on a side surface of the gate electrode. In an inter-layer insulating film covering the semiconductor substrate and the gate electrode, contact holes for connecting to the n-type source contact region and the p-type body contact region are formed.

In the structure disclosed in Patent Document 1, it is necessary to design the layout of the gate electrode and the contact hole taking the processing accuracy of the gate electrode and the processing accuracy of the contact hole into consideration for preventing the occurrence of leakage current between the gate electrode and the contact hole. For this reason, there is a problem that it is difficult to reduce an element area.

SUMMARY

The invention is to solve the technical problems described above. An advantage of some aspects of the invention is to enable a reduction in the element area of a DMOS transistor.

In one aspect of the invention, a semiconductor device includes: a semiconductor substrate including a first surface; a body region positioned in the semiconductor substrate and positioned to be in contact with the first surface; a gate insulating film positioned to be in contact with the body region on the first surface; a gate electrode positioned on the gate insulating film; a first insulator film covering at least a portion of a side surface of the gate electrode; a contact region positioned to be in contact with the first surface at a position different from that of the gate electrode, in a plan view relative to the first surface, in the body region; and a second insulator film including a material different from that of the first insulator film, positioned on the body region, the gate electrode, and the first insulator film, and including a contact hole on the contact region.

According to this aspect, since the first insulator film and the second insulator film include different materials from each other, the first insulator film can be prevented from being scraped when forming the contact hole in the second insulator film. Due to this, it is possible to reduce a distance between the position of the gate electrode and the position of the contact hole, so that the element area can be reduced.

In the aspect described above, it is preferable that the contact hole is positioned so as not to overlap the gate electrode in the plan view relative to the first surface.

According to this configuration, the contact hole that is formed by etching the second insulator film can be prevented from being opened in the gate electrode.

In the aspect described above, it is preferable that the contact hole is positioned to extend on at least a portion of the contact region and on at least a portion of the first insulator film.

According to this configuration, a conductive path from the contact hole to the body region just below the gate insulating film can be shortened to reduce the on-resistance of the element per area.

In the aspect described above, it is preferable that the semiconductor device further includes: a well of a first conductivity type; a body contact region of a second conductivity type; and a drain contact region of the first conductivity type, that the well is positioned to be in contact with the first surface in the semiconductor substrate, that the body region of the second conductivity type is positioned in the well, that the body contact region is positioned to be in contact with the first surface at a position different from positions of the gate electrode and the contact region of the first conductivity type, in the plan view relative to the first surface, in the body region, and that the drain contact region is positioned at a position away from the body region in the well.

According to this configuration, the element area of the DMOS transistor can be reduced.

In another aspect of the invention, a semiconductor device includes: a semiconductor substrate including a first surface; a third insulator film positioned at the first surface of the semiconductor substrate; a first insulator film positioned on at least a portion of an edge of the third insulator film on one side in a plan view thereof; a contact region positioned to be in contact with the first surface at a position different from that of the third insulator film, in a plan view relative to the first surface, in the semiconductor substrate; and a second insulator film including a material different from that of the first insulator film, positioned on the third insulator film and the first insulator film, and including a contact hole on the contact region.

According to this aspect, since the first insulator film and the second insulator film include different materials from each other, the first insulator film and the third insulator film below the first insulator film can be prevented from being scraped when forming the contact hole in the second insulator film.

In the aspect described above, it is preferable that the semiconductor device further includes a conductive layer positioned on a portion of the third insulator film, and that the first insulator film covers at least a portion of a side surface of the conductive layer.

According to this configuration, the conductive layer can be formed simultaneously with a constituent portion such as the gate electrode of the transistor, and the first insulator film can be formed simultaneously with a sidewall of the gate electrode.

In the aspect described above, it is preferable that the contact hole is positioned so as not to overlap the conductive layer in the plan view relative to the first surface.

In the aspect described above, it is preferable that the contact hole is positioned to extend on at least a portion of the contact region and on at least a portion of the first insulator film.

In the aspect described above, it is preferable that the semiconductor device further includes: a well of a first conductivity type; a body region of a second conductivity type; a gate insulating film; a gate electrode; a source contact region of the first conductivity type; and a body contact region of the second conductivity type, that the well is positioned to be in contact with the first surface in the semiconductor substrate, that the body region is positioned to be in contact with the first surface in the well, that the gate insulating film is positioned to be in contact with the body region on the first surface, that the gate electrode is positioned on the gate insulating film, that the source contact region and the body contact region are positioned to be in contact with the first surface at positions different from a position of the gate electrode, in the plan view relative to the first surface, in the body region, and that the contact region of the first conductivity type is positioned at a position away from the body region in the well.

According to this configuration, the element area of the DMOS transistor can be reduced.

In still another aspect of the invention, a method for manufacturing a semiconductor device includes: forming, in a semiconductor substrate, a body region positioned to be in contact with a first surface of the semiconductor substrate; forming a gate insulating film positioned to be in contact with the body region on the first surface; forming a gate electrode positioned on the gate insulating film; forming a first insulator film covering at least a portion of a side surface of the gate electrode; forming a contact region positioned to be in contact with the first surface at a position different from that of the gate electrode, in a plan view relative to the first surface, in the body region; forming a second insulator film including a material different from that of the first insulator film and positioned on the body region, the gate electrode, the first insulator film, and the contact region; and forming a contact hole in the second insulator film on the contact region.

According to this aspect, since the first insulator film and the second insulator film are formed of different materials from each other, the first insulator film can be prevented from being scraped when forming the contact hole in the second insulator film. Due to this, it is possible to reduce a distance between the position of the gate electrode and the position of the contact hole, so that the element area can be reduced.

In yet another aspect of the invention, a method for manufacturing a semiconductor device includes: forming a third insulator film positioned at a first surface of a semiconductor substrate; forming a first insulator film positioned on at least a portion of an edge of the third insulator film on one side in a plan view thereof; forming a contact region positioned to be in contact with the first surface at a position different from that of the third insulator film, in a plan view relative to the first surface, in the semiconductor substrate; forming a second insulator film including a material different from that of the first insulator film and positioned on the third insulator film, the first insulator film, and the contact region; and forming a contact hole in the second insulator film on the contact region.

According to this aspect, since the first insulator film and the second insulator film are formed of different materials from each other, the first insulator film and the third insulator film below the first insulator film can be prevented from being scraped when forming the contact hole in the second insulator film.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail. The embodiments described below do not unduly limit the contents of the invention set forth in the appended claims. Moreover, not all of the configurations described in the embodiments may necessarily be indispensable as solving means of the invention. The same constituent elements are denoted by the same reference numerals and signs, and the description thereof is omitted.

1. Configuration of First Embodiment

Figure 1:
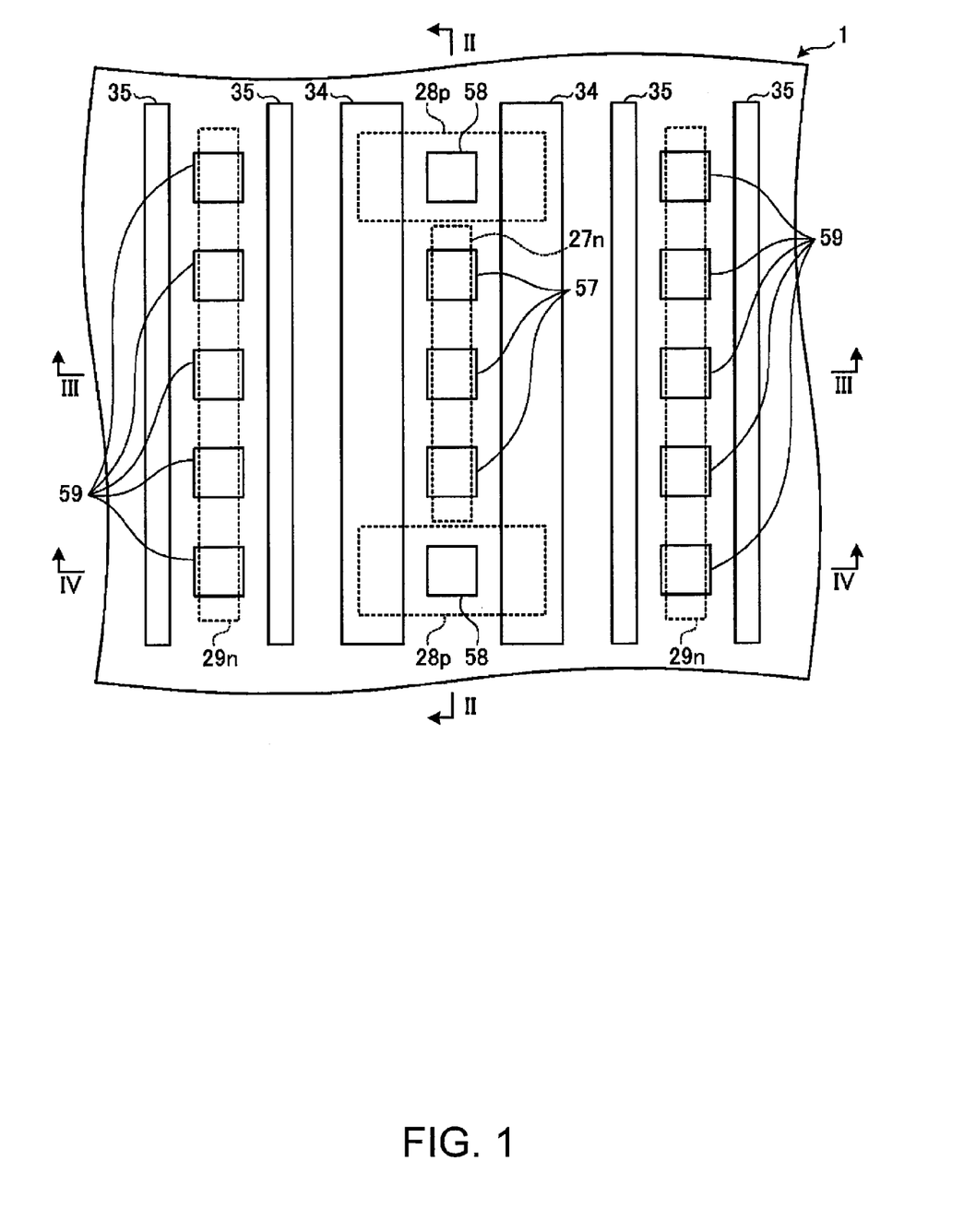
FIG. 1 is a plan view of a semiconductor device according to a first embodiment of the invention.
Figure 2:
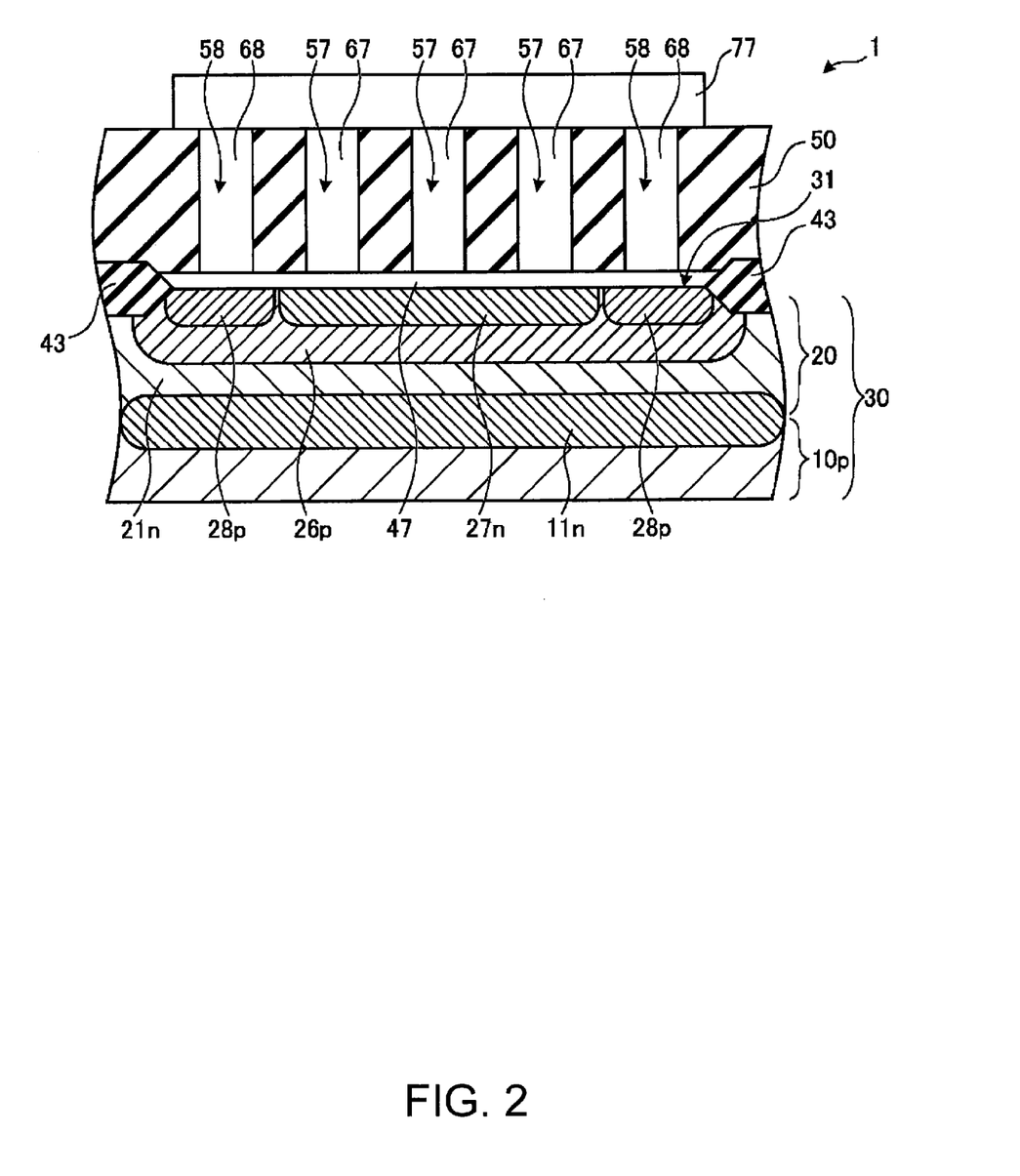
FIG. 2 is a cross-sectional view of the semiconductor device shown in FIG. 1 taken along the line II-II.
Figure 3:
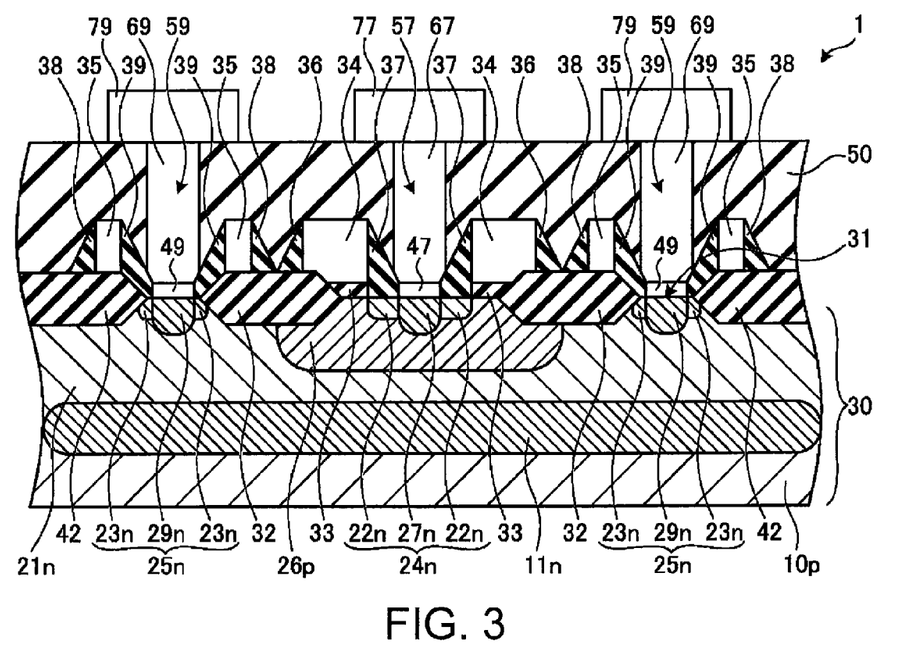
FIG. 3 is a cross-sectional view of the semiconductor device shown in FIG. 1 taken along the line
Figure 4:
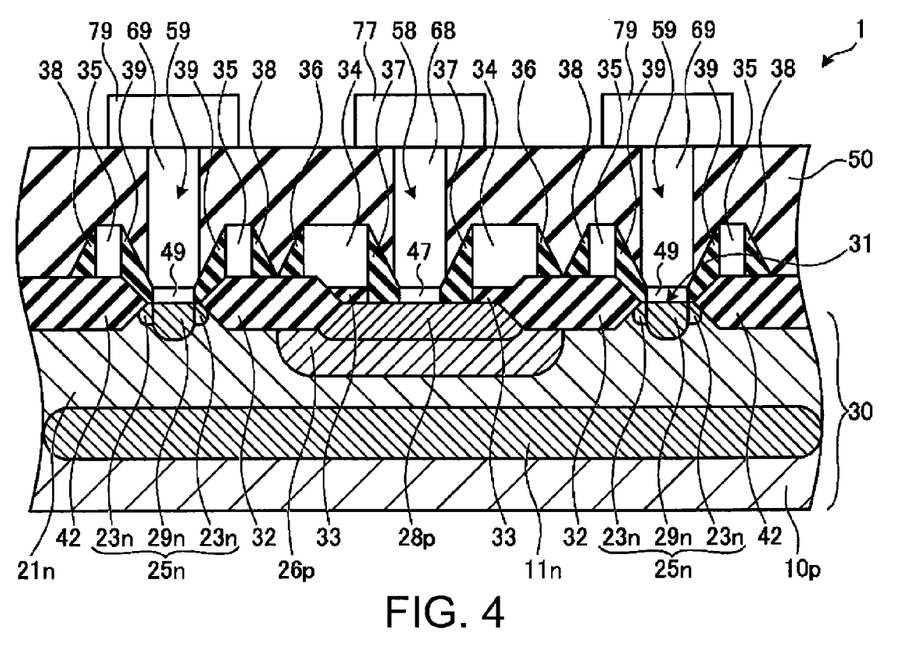
FIG. 4 is a cross-sectional view of the semiconductor device shown in FIG. 1 taken along the line IV-IV.
Figure 5:
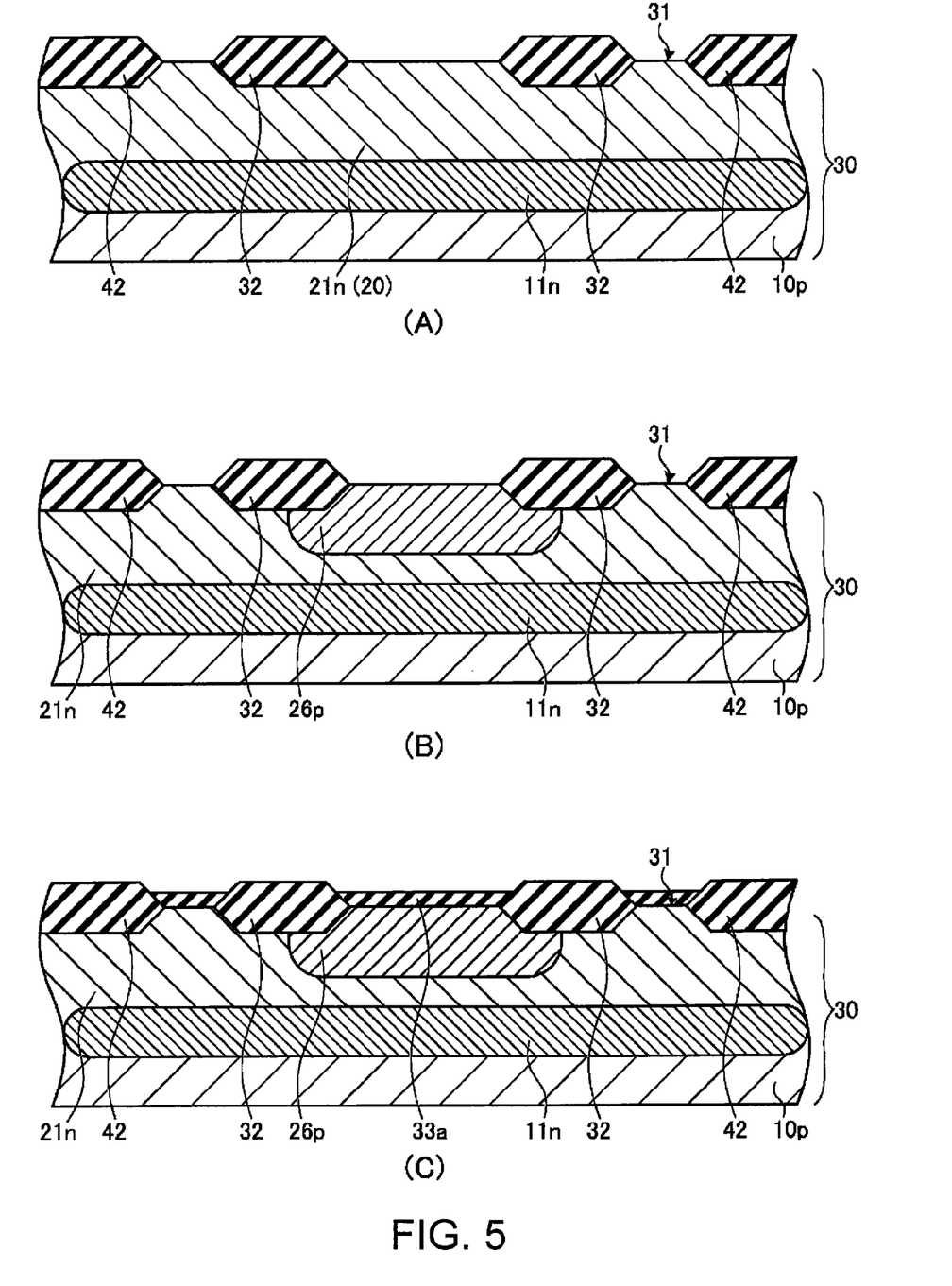
FIGS. 5A to 5C are cross-sectional views showing a method for manufacturing the semiconductor device.
Figure 6:
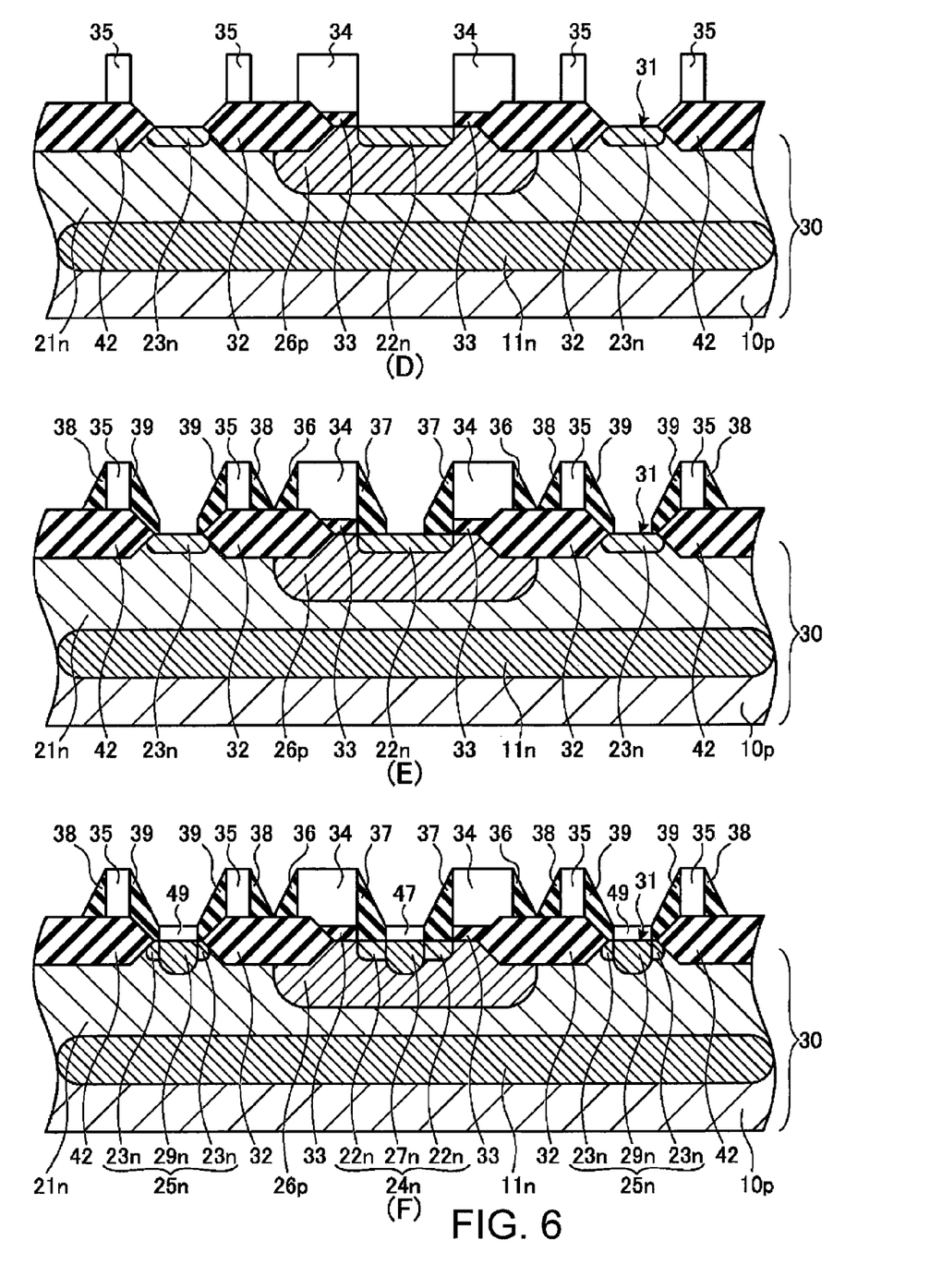
FIGS. 6D to 6F are cross-sectional views showing the method for manufacturing the semiconductor device.
Figure 7:
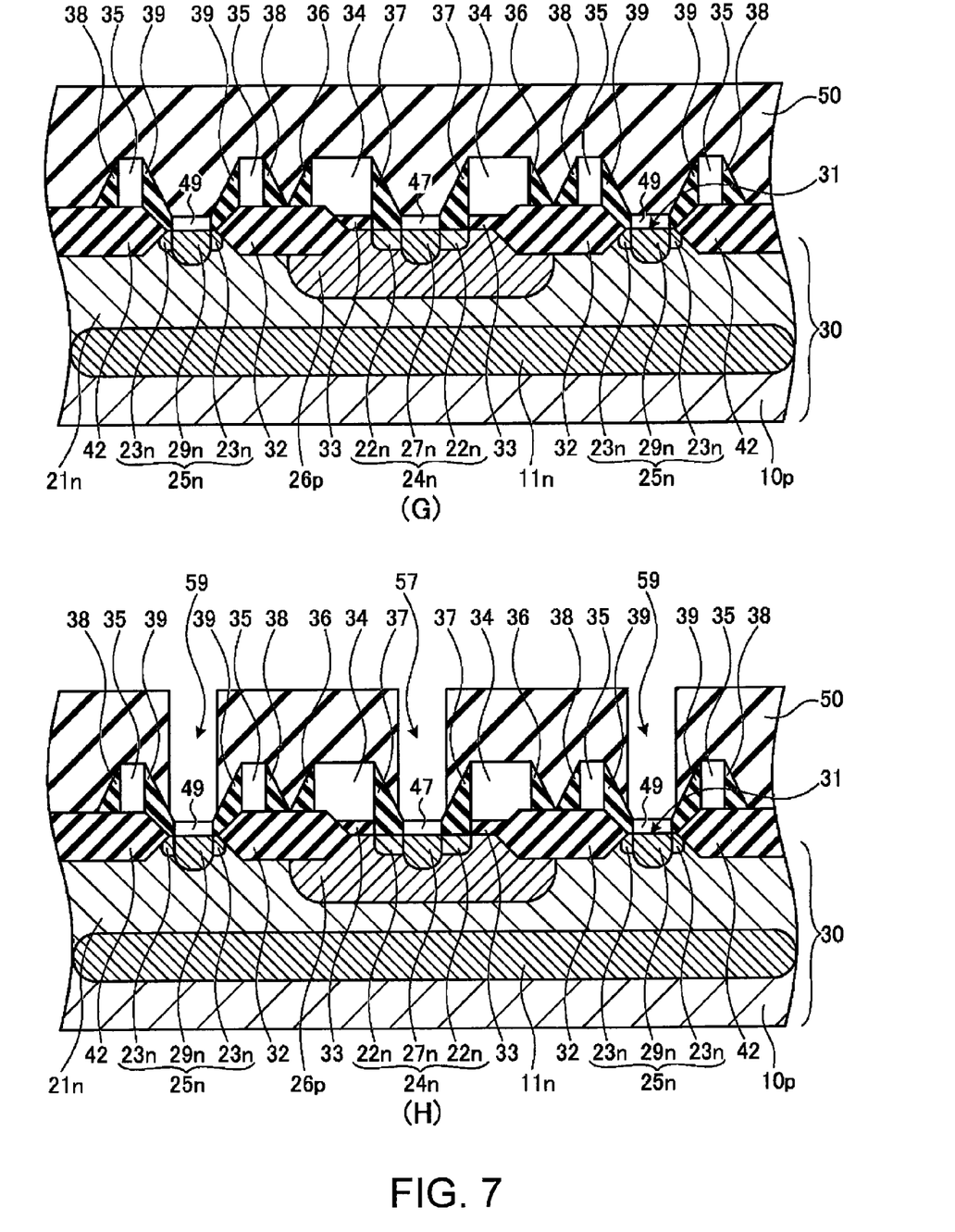
FIGS. 7G and 7H are cross-sectional views showing the method for manufacturing the semiconductor device.

FIG. 1 is a plan view of a semiconductor device according to a first embodiment of the invention. FIG. 2 is a cross-sectional view of the semiconductor device shown in FIG. 1 taken along the line II-II. FIG. 3 is a cross-sectional view of the semiconductor device shown in FIG. 1 taken along the line FIG. 4 is a cross-sectional view of the semiconductor device shown in FIG. 1 taken along the line IV-IV.

A semiconductor device 1 according to the first embodiment is a DMOS transistor, in which a body region 26$p$ of a second conductivity type is positioned in a well 21$n$ of a first conductivity type positioned in a semiconductor substrate 30. In the body region 26$p$, a high-concentration source contact region 27$n$ of the first conductivity type and high-concentration body contact regions 28$p$ of the second conductivity type are positioned. High-concentration drain contact regions 29$n$ of the first conductivity type are positioned at positions away from the body regions 26$p$ in the well 21$n$.

The semiconductor device 1 further includes a plurality of gate insulating films 33, a plurality of gate electrodes 34, first insulator films 36 and 37, and a second insulator film 50. In the second insulator film 50, contact holes 57 and 58 are positioned.

The semiconductor device 1 further includes third insulator films 32 and 42, a plurality of conductive layers 35, and first insulator films 38 and 39. Further, contact holes 59 are positioned in the second insulator film 50.

For the description in the embodiment, the character "n" or "p" corresponding to the conductivity type is added to the reference numeral of each portion of the semiconductor device 1. In the embodiment, the n-type corresponds to the first conductivity type, while the p-type corresponds to the second conductivity type. However, the n-type and the p-type may be reversed.

The semiconductor substrate 30 includes an under layer 10$p$ and an epitaxial layer 20 (refer to FIG. 2). The under layer 10$p$ is composed of single-crystal silicon including an impurity of the second conductivity type. The epitaxial layer 20 is composed of silicon that is epitaxially grown on one of surfaces of the under layer 10$p$. In the embodiment, "upper" indicates a direction from the under layer 10$p$ toward the epitaxial layer 20 along a thickness direction of the semiconductor substrate 30. An upper surface of the epitaxial layer 20 is defined as a first surface 31 of the semiconductor substrate 30.

A buried diffusion layer 11n is positioned in a region extending to a portion of the under layer 10p and a portion of the epitaxial layer 20. The buried diffusion layer 11n includes a high concentration of impurity of the first conductivity type. In the epitaxial layer 20, the well 21n including a relatively low concentration of impurity of the first conductivity type is formed.

The body region 26p is positioned to be in contact with the first surface 31 of the semiconductor substrate 30 in the well 21n. The body region 26p includes an impurity of the second conductivity type. As shown in FIG. 2, the body region 26p has an elongated shape in the longitudinal direction in FIG. 1.

In the body region 26p, the high-concentration body contact regions 28p of the second conductivity type and the high-concentration source contact region 27n of the first conductivity type are positioned. Both of the body contact regions 28p and the source contact region 27n are in contact with the first surface 31 of the semiconductor substrate 30. As shown in FIG. 2, the source contact region 27n has an elongated shape in the longitudinal direction in FIG. 1. The two body contact regions 28p are arranged so as to interpose the source contact region 27n from both sides in the longitudinal direction in FIG. 1.

The plurality of gate insulating films 33 are positioned on the first surface 31 of the semiconductor substrate 30 while being in contact with portions of the body region 26p in the vicinity of both edges of the body region 26p in the transverse direction of FIG. 3. The gate insulating film 33 is composed of, for example, silicon oxide.

Any of the plurality of gate electrodes 34 is positioned to extend on the gate insulating film 33 and on a portion of the third insulator film 32. The plurality of gate electrodes 34 are composed of, for example, polycrystalline silicon.

The first insulator films 36 and 37 functioning as sidewalls are positioned on side surfaces of the gate electrode 34 and the gate insulating film 33. The first insulator film 36 is positioned on side surfaces of the plurality of gate electrodes 34 on the side far from the source contact region 27n and the body contact regions 28p. The first insulator film 37 is positioned on side surfaces (inner side surfaces) of the plurality of gate electrodes 34 on the side close to the source contact region 27n and the body contact regions 28p. The first insulator film 37 includes at least partially a layer of silicon nitride.

Between the first insulator films 37 positioned on the inner side surfaces of the plurality of gate electrodes 34, a silicide film 47 having conductivity is positioned on the first surface 31 of the semiconductor substrate 30. As shown in FIG. 2, the silicide film 47 has an elongated shape in the longitudinal direction in FIG. 1. The silicide film 47 is in contact with the source contact region 27n and the body contact regions 28p. As shown in FIG. 3, a source region 24n in the body region 26p is composed of offset diffusion regions 22n below the first insulator films 37 and the source contact region 27n.

The second insulator film 50 is positioned on the body region 26p, the plurality of gate electrodes 34, and the first insulator films 36 and 37. The second insulator film 50 functions as an inter-layer insulating film that insulates wiring layers 77 and 79 (described later) formed on the second insulator film 50 from the plurality of gate electrodes 34 or the like. The second insulator film 50 includes the plurality of contact holes 57 and 58 positioned on the silicide film 47. As shown in FIGS. 1 and 2, the plurality of contact holes 57 and 58 are arranged in line in the longitudinal direction in FIG. 1. The second insulator film 50 is composed of, for example, silicon oxide.

In the contact hole 57, a buried metal layer 67 connected with the source contact region 27n via the silicide film 47 is positioned. In the contact hole 58, a buried metal layer 68 connected with the body contact region 28p via the silicide film 47 is positioned. On the second insulator film 50, the wiring layer 77 connected with the buried metal layers 67 and 68 is positioned.

In the embodiment, the first insulator film 37 includes a material (silicon nitride) different from that of the second insulator film 50. Therefore, when forming the contact holes 57 and 58 in the second insulator film 50, the first insulator film 37 can be prevented from being etched. Due to this, leakage current can be prevented from occurring between the gate electrode 34 and the buried metal layers 67 and 68 positioned in the contact holes 57 and 58. Accordingly, it is possible in the accuracy of alignment between the contact holes 57 and 58 and the gate electrode 34 to provide margin corresponding to the width of the first insulator film 37 in the transverse direction of FIG. 3. Due to this, the element area can be reduced. The first insulator film 37 is not limited to the case of including silicon nitride but may include another material having sufficient etching selectivity relative to the material of the second insulator film 50, for example, silicon oxynitride.

Moreover, as shown in FIG. 3, since the contact hole 57 is formed at a position to be in contact with the first insulator film 37, it is possible to shorten a distance from the buried metal layer 67 formed in the contact hole 57 to a region that is positioned just below the gate insulating film and in which a channel is formed. Accordingly, the on-resistance (RonA) of the DMOS transistor per area can be reduced.

In the well 21n, the high-concentration drain contact regions 29n of the first conductivity type are positioned at positions different from the position of the body region 26p in a plan view. The plan view means a state as viewed from a direction perpendicular to the first surface 31. The drain contact regions 29n are in contact with the first surface 31 of the semiconductor substrate 30. The drain contact region 29n has an elongated shape in the longitudinal direction in FIG. 1.

The third insulator films 32 and 42 are positioned at the first surface 31 of the semiconductor substrate 30. The third insulator films 32 and 42 are composed of, for example, silicon oxide formed by a LOCOS (Local Oxidization of Silicon) method. The third insulator films 32 and 42 may be an insulator film formed by an STI (Silicon Trench Isolation) method. The third insulator film 32 positioned between the gate insulating film 33 and the drain contact region 29n has a function of offsetting the drain contact region 29n from the body region 26p to thereby improve the withstand voltage of the transistor. The third insulator film 42 positioned farther away from the body region 26p than the drain contact region 29n has a function of isolating the semiconductor device 1 from another element (not shown) formed on the semiconductor substrate 30. Also the third insulator film 43 (refer to FIG. 2) has a function of isolating the semiconductor device 1 from another element (not shown) formed on the semiconductor substrate 30. As shown in FIG. 3, drain regions 25n are each composed of offset diffusion regions 23n below the first insulator films 39 and the drain contact region 29n.

Each of the plurality of conductive layers 35 is positioned on the third insulator film 32 or 42. The plurality of conductive layers 35 are composed of the same material as that of the plurality of gate electrodes 34. Electrical continuity may not be established between the plurality of conductive layers 35 and the gate electrode 34 or the like. The plurality of conductive layers 35 may be so-called dummy layers.

The first insulator films 38 and 39 are positioned on side surfaces of the conductive layer 35. The first insulator film 38 is positioned on side surfaces of the plurality of conductive layers 35 on the side far from the drain contact region 29n. The first insulator film 39 is positioned on side surfaces (inner side surfaces) of the plurality of conductive layers 35 on the side close to the drain contact region 29n. The first insulator film 39 includes at least partially a layer of silicon nitride. The first insulator film 39 is arranged so as to be overlaid on edges (inner edges) of the third insulator films 32 and 42 closer to the drain contact region 29n. When the first insulator film 39 can be formed, the conductive layer 35 may be omitted.

Between the first insulator films 39 positioned on the inner side surfaces of the plurality of conductive layers 35, a silicide film 49 having conductivity is positioned on the first surface 31 of the semiconductor substrate 30. The silicide film 49 has an elongated shape in the longitudinal direction in FIG. 1. The silicide film 49 is in contact with the drain contact region 29n.

The second insulator film 50 described above is positioned also on the third insulator films 32 and 42 or the first insulator films 38 and 39. The second insulator film 50 includes the plurality of contact holes 59 positioned on the silicide film 49. The plurality of contact holes 59 are arranged in line in the longitudinal direction in FIG. 1.

A buried metal layer 69 connected with the drain contact region 29n via the silicide film 49 is positioned in the contact hole 59. The wiring layer 79 connected with the buried metal layer 69 is positioned on the second insulator film 50.

In the embodiment, the first insulator film 39 includes a material (silicon nitride) different from that of the second insulator film 50. Therefore, when forming the contact hole 59 in the second insulator film 50, the inner edges of the third insulator films 32 and 42 positioned below the first insulator films 39 can be prevented from being etched. Due to this, it is possible to prevent a reduction in the drain offset function of the third insulator film 32 or in the element isolation function of the third insulator film 42. Accordingly, it is possible in the accuracy of alignment between the contact hole 59 and the third insulator films 32 and 42 to provide margin corresponding to the width of the first insulator film 39 in the transverse direction of FIG. 3. Due to this, the element area can be reduced. The first insulator film 39 is not limited to the case of including silicon nitride but may include another material having sufficient etching selectivity relative to the material of the second insulator film 50, for example, silicon oxynitride.

2. Manufacturing Method

FIGS. 5A to 7H are cross-sectional views showing a method for manufacturing the semiconductor device.

First, as shown in FIG. 5A, the well 21n is formed in the semiconductor substrate 30 including the buried diffusion layer 11n that is formed in the region extending to a portion of the under layer 10p and a portion of the epitaxial layer 20. Further, the plurality of third insulator films 32 and 42 are formed at the first surface 31 of the semiconductor substrate 30. The third insulator films 32 and 42 are formed by, for example, a LOCOS method.

Next, as shown in FIG. 5B, the body region 26p of the second conductivity type positioned to be in contact with the first surface 31 of the semiconductor substrate 30 is formed.

Next, as shown in FIG. 5C, an oxide film 33a serving as the gate insulating film 33 is formed on the first surface 31 of the semiconductor substrate 30. At least a portion of the oxide film 33a is in contact with the body region 26p.

Next, a conductive layer serving as the gate electrode 34 and the conductive layer 35 is formed on the oxide film 33a and the third insulator films 32 and 42. By patterning the conductive layer and the oxide film 33a, the gate electrodes 34, the conductive layers 35, and the gate insulating films 33 are formed as shown in FIG. 6D. The gate electrode 34 is positioned to extend on the gate insulating film 33 and on the third insulator film 32. Each of the conductive layers 35 is positioned on the third insulator film 32 or the third insulator film 42. Further, the offset diffusion regions 22n and 23n are formed in the first surface 31 of the semiconductor substrate 30 by an ion implantation method using a resist film pattern (not shown) as a mask.

Next, an insulator film is formed by a CVD method or the like. By etching the entire surface of the insulator film, the first insulator films 36 and 37 functioning as sidewalls are formed on the side surfaces of the gate electrode 34 while the first insulator films 38 and 39 are formed on the side surfaces of the conductive layer 35 as shown in FIG. 6E. The first insulator film 37 and the first insulator film 39 are formed so as to at least partially include a layer of silicon nitride or silicon oxynitride. The first insulator film 39 is formed so as to be covered on the inner edges of the third insulator films 32 and 42.

Next, as shown in FIG. 6F, the source contact region 27n of the first conductivity type positioned to be in contact with the first surface 31 of the semiconductor substrate 30 is formed in the body region 26p while the drain contact regions 29n of the first conductivity type positioned to be in contact with the first surface 31 of the semiconductor substrate 30 are formed in the well 21n. The source contact region 27n is formed, through self-alignment using the first insulator film 37, at a position different from that of the gate electrode 34 in the plan view relative to the first surface 31. The drain contact regions 29n are formed, through self-alignment using the first insulator film 39, at positions different from those of the third insulator films 32 and 42 in the plan view relative to the first surface 31.

Further, the body contact regions 28p of the second conductivity type positioned to be in contact with the first surface 31 of the semiconductor substrate 30 are formed in the body region 26p (refer to FIGS. 1, 2, and 4).

Further, as shown in FIG. 6F, the silicide film 47 is formed on the source contact region 27n and the body contact regions 28p, while the silicide film 49 is formed on the drain contact regions 29n.

Next, as shown in FIG. 7G, the second insulator film 50 functioning as an inter-layer insulating film is formed on the body region 26p, the third insulator films 32 and 42, the gate electrodes 34, the first insulator films 36, 37, 38 and 39, the source contact region 27n, the body contact regions 28p, and the drain contact regions 29n. The second insulator film 50 is formed of silicon oxide.

Next, as shown in FIG. 7H, the contact holes 57, 58, and 59 are formed in the second insulator film 50 on the source contact region 27n, the body contact regions 28p, and the drain contact regions 29n, respectively. In the embodiment, since the first insulator films 37 and 39 are composed of a material different from that of the second insulator film 50, the first insulator films 37 and 39 can be prevented from being scraped when forming the contact holes 57, 58, and 59.

Further, the buried metal layers 67, 68, and 69 (refer to FIGS. 2, 3, and 4) are formed in the contact holes 57, 58, and 59, respectively. Further, the wiring layer 77 (refer to FIGS. 2, 3, and 4) connected with the buried metal layers 67 and 68 and the wiring layer 79 (refer to FIGS. 3 and 4) connected with the buried metal layer 69 are formed on the second insulator film 50.

Through the steps described above, the semiconductor device 1 according to the first embodiment is manufactured.

3. Second Embodiment

Figure 8A:
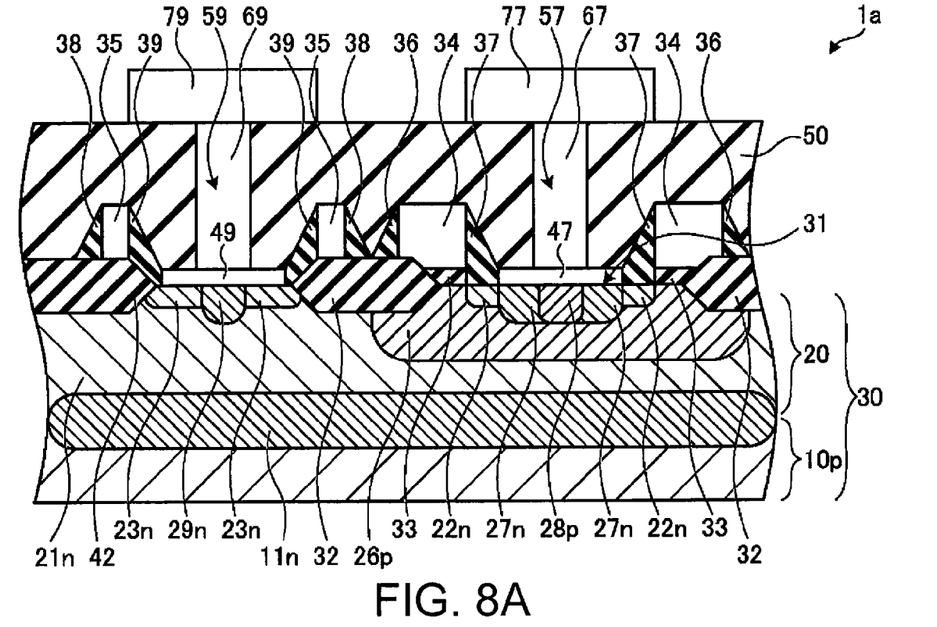
FIGS. 8A and 8B are cross-sectional views of a semiconductor device according to a second embodiment of the invention.
Figure 8B:
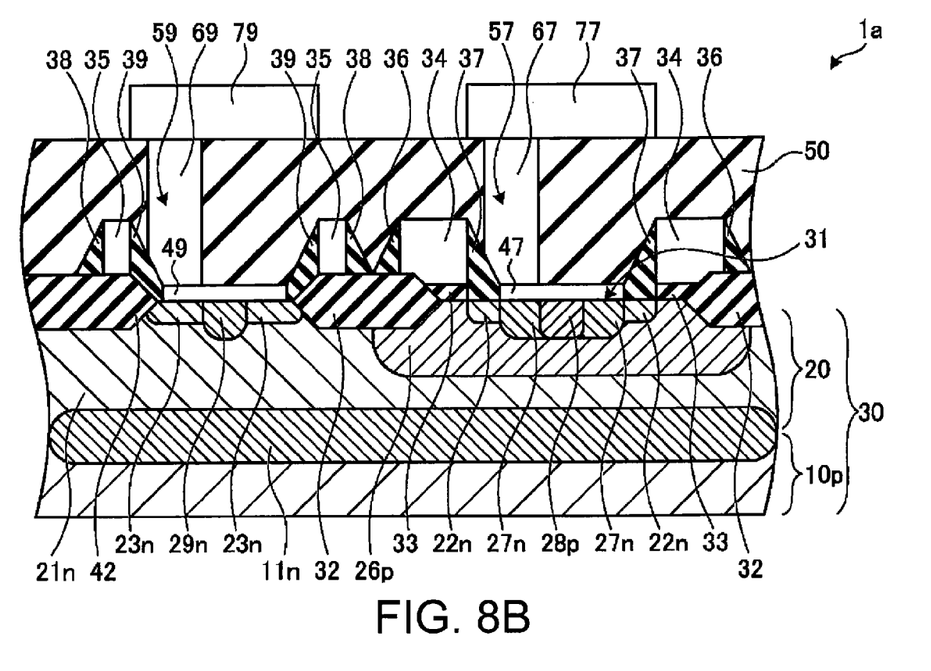

FIGS. 8A and 8B are cross-sectional views of a semiconductor device according to a second embodiment of the invention. In FIGS. 8A and 8B, the drain contact region 29n on the left side of FIGS. 8A and 8B in the plurality of drain contact region 29n is shown, and the drain contact region on the right side of FIGS. 8A and 8B and the surrounding configuration are not illustrated.

A semiconductor device 1a according to the second embodiment differs from the semiconductor device of the first embodiment in that the source contact regions 27n are positioned in the body region 26p, and that the body contact region 28p is positioned at the center of the source contact regions 27n as viewed in the transverse direction in FIGS. 8A and 8B. The body contact region 28p is connected with the body region 26p in the thickness direction of the semiconductor substrate 30. The silicide film 47 is positioned on the source contact regions 27n and the body contact region 28p, and the contact hole 57 is positioned on a portion of the silicide film 47. Therefore, the buried metal layer 67 in the contact hole 57 is connected to both of the source contact region 27n and the body contact region 28p.

Even in the configuration of the second embodiment, it is not always true that, as shown in FIG. 8A, the contact hole 57 is formed at the center position between the plurality of gate electrodes 34, and that the contact hole 59 is formed at the center position between the third insulator films 32 and 42. For example, as shown in FIG. 8B, the misalignment between the plurality of gate electrodes 34 and the contact hole 57 or the misalignment between the third insulator films 32 and 42 and the contact hole 59 may occur in some cases. However, the first insulator films 37 and 39 are composed of a material different from that of the second insulator film 50. Therefore, the first insulator films 37 and 39 are prevented from being scraped when forming the contact holes 57 and 59. Due to this, it is possible to prevent leakage current from occurring between the gate electrode 34 and the buried metal layer 67 positioned in the contact hole 57. Moreover, it is possible to prevent the drain offset function or the element isolation function from being impaired due to the third insulator films 32 and 42 being scraped.

In the embodiments of the invention, when the sentence "a specific member A (hereinafter referred to as 'A') is positioned (A is provided) on (or below) another specific member B (hereinafter referred to as 'B')" is used, such a sentence is not limited to the case where A is positioned (A is provided) directly on (or below) B. Such a sentence also includes the case where A is positioned (A is provided) on (or below) B via still another member within a range not impairing the operational effect according to the invention.

Moreover, in the embodiments of the invention, the contact region is an impurity region electrically connected to the buried metal layer in the contact hole. The contact region and the buried metal layer may be in direct contact with each other, or may be electrically connected with each other via a conductive film such as a silicide film. Regions of source, drain, and body regions, which correspond to the contact region described above, are referred to as a source contact region, a drain contact region, and a body contact region, respectively.

The entire disclosure of Japanese Patent Application No. 2013-086352, filed Apr. 17, 2013 is expressly incorporated by reference herein.

What is claimed is:

1. A semiconductor device comprising:
a semiconductor substrate including a first surface;
a body region positioned in the semiconductor substrate and positioned to be in contact with the first surface;
a gate insulating film positioned to be in contact with the body region on the first surface;
a gate electrode positioned on the gate insulating film;
a first insulator film covering at least a portion of a side surface of the gate electrode;
a contact region positioned to be in contact with the first surface at a position different from that of the gate electrode, in a plan view relative to the first surface, in the body region;
a second insulator film including a material different from that of the first insulator film, positioned on the body region, the gate electrode, and the first insulator film; and
a contact hole in the second insulator film on the contact region, the contact hole being positioned to extend on at least a portion of the contact region and on at least a portion of the first insulator film.

2. The semiconductor device according to claim 1, wherein the contact hole is positioned so as not to overlap the gate electrode in the plan view relative to the first surface.

3. A semiconductor device comprising:
a semiconductor substrate including a first surface;
a well of a first conductivity type positioned to be in contact with the first surface in the semiconductor substrate;
a body region of a second conductivity type positioned in the well and positioned to be in contact with the first surface;
a gate insulating film positioned to be in contact with the body region on the first surface;
a gate electrode positioned on the gate insulating film;
a first insulator film covering at least a portion of a side surface of the gate electrode;
a contact region positioned to be in contact with the first surface at a position different from that of the gate electrode, in a plan view relative to the first surface, in the body region;
a second insulator film including a material different from that of the first insulator film, positioned on the body region, the gate electrode, and the first insulator film, and including a contact hole on the contact region;
a body contact region of a second conductivity type, the body contact region being positioned to be in contact with the first surface at a position different from positions of the gate electrode and the contact region of the first conductivity type, in the plan view relative to the first surface, in the body region; and
a drain contact region of the first conductivity type, the drain contact region being positioned at a position away from the body region in the well.

4. A semiconductor device comprising:
a semiconductor substrate including a first surface;
a third insulator film positioned at the first surface of the semiconductor substrate;
a first insulator film positioned on at least a portion of an edge of the third insulator film on one side in a plan view thereof;
a contact region positioned to be in contact with the first surface at a position different from that of the third insulator film, in a plan view relative to the first surface, in the semiconductor substrate;
a second insulator film including a material different from that of the first insulator film, positioned on the third insulator film and the first insulator film; and
a contact hole in the second insulator film on the contact region, the contact hole being positioned to extend on at least a portion of the contact region and on at least a portion of the first insulator film.

5. The semiconductor device according to claim 4, further comprising a conductive layer positioned on a portion of the third insulator film, wherein the first insulator film covers at least a portion of a side surface of the conductive layer.

6. The semiconductor device according to claim 5, wherein the contact hole is positioned so as not to overlap the conductive layer in the plan view relative to the first surface.

7. A semiconductor device comprising;
a semiconductor substrate including a first surface;
a well of a first conductivity type positioned to be in contact with the first surface in the semiconductor substrate;
a body region of a second conductivity type positioned in the well and positioned to be in contact with the first surface;
a third insulator film positioned at the first surface of the semiconductor substrate;
a first insulator film positioned on at least a portion of an edge of the third insulator film on one side in a plan view thereof;
a contact region positioned to be in contact with the first surface at a position different from that of the third insulator film, in a plan view relative to the first surface, in the semiconductor substrate;
a second insulator film including a material different from that of the first insulator film, positioned on the third insulator film and the first insulator film, and including a contact hole on the contact region;
a gate insulating film, the gate insulating film being positioned to be in contact with the body region on the first surface;
a gate electrode positioned on the gate insulating film; and
a source contact region of the first conductivity type,
wherein:
the source contact region and the body contact region are positioned to be in contact with the first surface at positions different from a position of the gate electrode, in the plan view relative to the first surface, in the body region, and
the contact region of the first conductivity type is positioned at a position away from the body region in the well.

8. The semiconductor device according to claim 3, wherein the contact hole is positioned so as not to overlap the gate electrode in the plan view relative to the first surface.

9. The semiconductor device according to claim 7, wherein the contact hole is positioned so as not to overlap the gate electrode in the plan view relative to the first surface.

10. The semiconductor device according to claim 7, further comprising a conductive layer positioned on a portion of the third insulator film, wherein
the first insulator film covers at least a portion of a side surface of the conductive layer.

11. The semiconductor device according to claim 10, wherein
the contact hole is positioned so as not to overlap the conductive layer in the plan view relative to the first surface.

* * * * *